(12) United States Patent
Sung

(10) Patent No.: US 12,389,605 B2
(45) Date of Patent: Aug. 12, 2025

(54) SEMICONDUCTOR DEVICE AND METHOD FOR FABRICATING THE SAME

(71) Applicant: SK hynix Inc., Gyeonggi-do (KR)

(72) Inventor: Min Chul Sung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 463 days.

(21) Appl. No.: 18/072,180

(22) Filed: Nov. 30, 2022

(65) Prior Publication Data

US 2023/0422514 A1 Dec. 28, 2023

(30) Foreign Application Priority Data

Jun. 28, 2022 (KR) .......................... 10-2022-0078774

(51) Int. Cl.
| | |
|---|---|
| *H10B 53/20* | (2023.01) |
| *H01L 23/528* | (2006.01) |
| *H10B 53/10* | (2023.01) |
| *H10B 53/40* | (2023.01) |

(52) U.S. Cl.
CPC ......... *H10B 53/20* (2023.02); *H01L 23/5283* (2013.01); *H10B 53/10* (2023.02); *H10B 53/40* (2023.02)

(58) Field of Classification Search
None
See application file for complete search history.

(56) References Cited

U.S. PATENT DOCUMENTS

| | | | |
|---|---|---|---|
| 2020/0083225 A1* | 3/2020 | Ma | G11C 11/401 |
| 2021/0125991 A1* | 4/2021 | Kim | H10D 1/714 |
| 2021/0159229 A1* | 5/2021 | Gomes | H10D 62/121 |
| 2021/0159231 A1* | 5/2021 | Lee | H10B 12/50 |
| 2021/0272604 A1* | 9/2021 | Kang | H10B 12/482 |

* cited by examiner

*Primary Examiner* — Steven M Page
(74) *Attorney, Agent, or Firm* — IP & T GROUP LLP

(57) ABSTRACT

A semiconductor device includes: a first common plate extending vertically in a first direction; a second common plate which is spaced apart from the first common plate in a second direction and extends vertically in the first direction; a slit formed between the first common plate and the second common plate; a first memory cell array sharing the first common plate and including first capacitors that are vertically stacked in the first direction; and a second memory cell array sharing the second common plate and including second capacitors that are vertically stacked in the first direction.

17 Claims, 12 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No, 10-2022-0078774, filed on Jun. 28, 2022, which is incorporated herein by reference in its entirety.

BACKGROUND

1. Field

Embodiments of the present invention relate to a semiconductor device and, more particularly, to a semiconductor device of a three-dimensional (3D) structure and a method for fabricating the same.

2. Description of the Related Art

The size of memory cells is being continuously reduced to increase the net die of a memory device. As the size of memory cells is miniaturized, it is required to reduce parasitic capacitance Cb and increase the capacitance as well. However, it is difficult to increase the net die due to the structural limitations of the memory cells.

Recently, three-dimensional (3-D) semiconductor memory devices including memory cells that are arranged in three dimensions are being suggested.

SUMMARY

Embodiments of the present invention are directed to a highly integrated semiconductor device, and a method for fabricating the semiconductor device.

In accordance with an embodiment of the present invention, a semiconductor device includes: a first common plate extending vertically in a first direction; a second common plate which is spaced apart from the first common plate in a second direction and extends vertically in the first direction; a slit formed between the first common plate and the second common plate; a first memory cell array sharing the first common plate and including first capacitors that are vertically stacked in the first direction; and a second memory cell array sharing the second common plate and including second capacitors that are vertically stacked in the first direction.

In accordance with another embodiment of the present invention, a semiconductor device includes: a substructure; a first capacitor array including first capacitors that are arranged in a first direction which is perpendicular to a surface of the lower structure; a second capacitor array spaced apart from the first capacitor array in a second direction and including second capacitors that are vertically arranged in the first direction; a first common plate extending vertically in the first direction and coupled to the first capacitor array; a second common plate extending vertically in the first direction and coupled to the second capacitor array; and a slit positioned between the first common plate and the second common plate and extending vertically in the first direction.

In accordance with yet another embodiment of the present invention, a method for fabricating a semiconductor device includes: forming a stack body over a lower structure; forming a slit in the stack body to divide the stack body into a first stack body and a second stack body; forming a first capacitor recess and a second capacitor recess that are separated from each other with the slit interposed therebetween by etching the first stack body and the second stack body; and forming a first capacitor and a second capacitor in the first capacitor recess and the second capacitor recess, respectively. The forming of the first capacitor recess and the second capacitor recess includes: etching the first stack body and the second stack body to form a first vertical opening and a second vertical opening that are separated from each other with the slit interposed therebetween; forming a first capacitor recess by horizontally recessing a portion of the first stack body from the first vertical opening; and forming a second capacitor recess by horizontally recessing a portion of the second stack body from the second vertical opening. The forming of the first capacitor and the second capacitor includes: sequentially forming a storage node, a dielectric layer, and a plate node in the first capacitor recess and the second capacitor recess, individually. The method further includes after the forming of the first capacitor and the second capacitor, forming a first metal interconnection coupled to the first capacitor; and forming a second metal interconnection coupled to the second capacitor. The stack body includes a first dielectric layer, a first sacrificial layer, a semiconductor layer, a second sacrificial layer, and a second dielectric layer that are stacked in a mentioned order, and a portion of the first sacrificial layer, a portion of the semiconductor layer, and a portion of the second sacrificial layer are etched to form the first capacitor recess and the second capacitor recess. The first and second dielectric layers include silicon oxide, and the first and second sacrificial layers include silicon nitride, Each of the first capacitor and the second capacitor includes: a storage node; a dielectric layer over the storage node; and a plate node over the dielectric layer, and the plate nodes of the first capacitor and the second capacitor extend in a direction perpendicular to the lower structure. Each of the first capacitors and the second capacitors includes: a storage node; a dielectric layer over the storage node; and a plate node over the dielectric layer, and the dielectric layer includes a high-k material or a ferroelectric material.

These and other advantages and features of the present invention will become apparent to the skilled person from the detailed description in conjunction with the following drawings.

DETAILED DESCRIPTION

Figure 1:
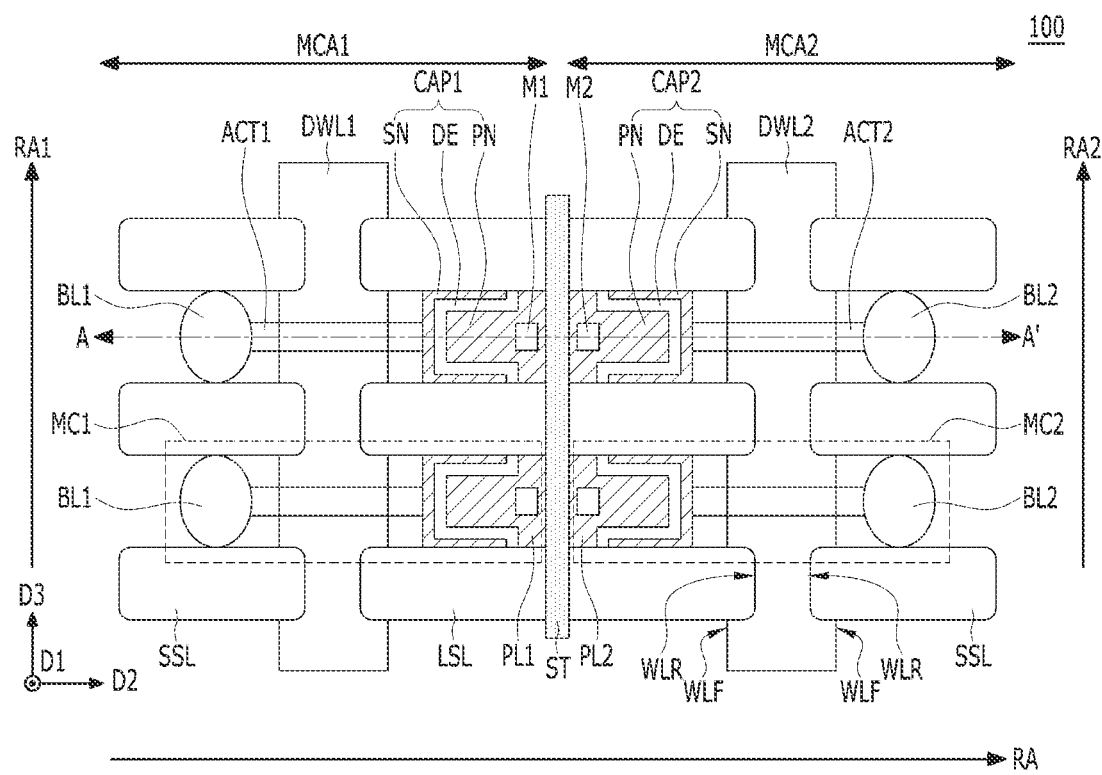
FIG. 1 is a schematic plan view illustrating a semiconductor device in accordance with an embodiment of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to the following embodiments of the present invention, it is possible to increase the memory cell density and reduce parasitic capacitance by vertically stacking memory cells.

Figure 2:
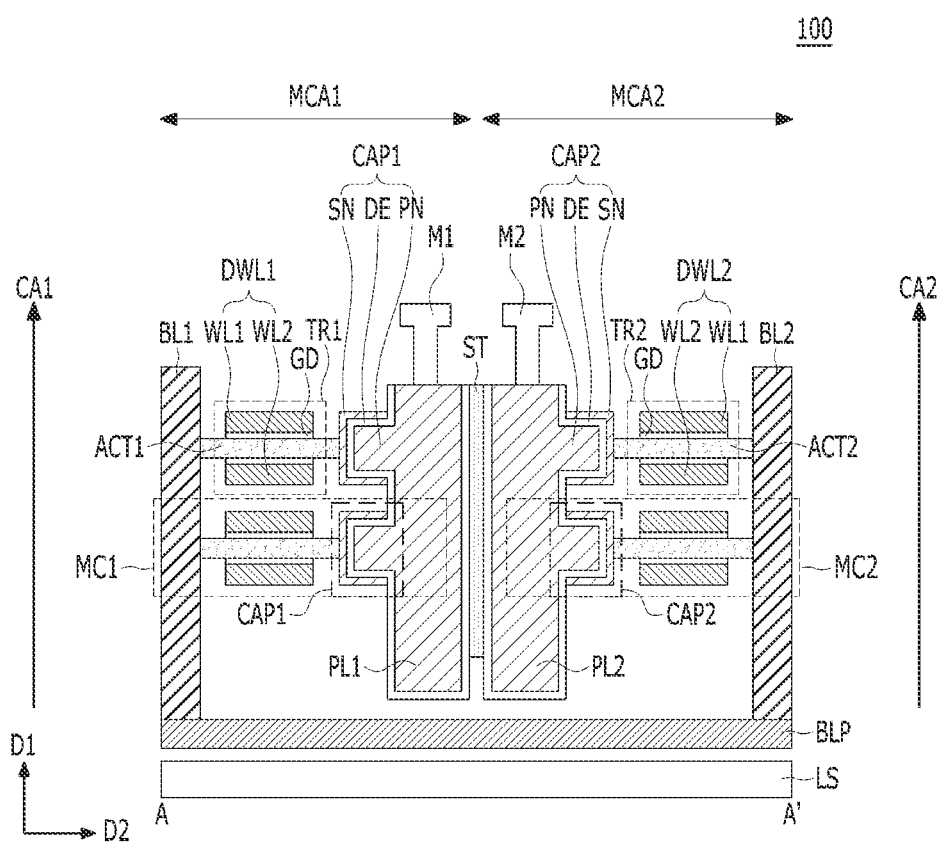
FIG. 2 is a cross-sectional view taken along a line A-A' shown in FIG. 1.

FIG. 1 is a schematic plan view illustrating a semiconductor device in accordance with an embodiment of the present invention. FIG. 2 is a cross-sectional view taken along a line A-A' shown in FIG. 1.

Referring to FIGS. 1 and 2, the semiconductor device 100 may include a lower structure LS and memory cell arrays MCA1 and MCA2 positioned over the lower structure LS. The memory cell arrays MCA1 and MCA2 include a first memory cell array MCA1 and a second memory cell array MCA2. The first memory cell array MCA1 and the second memory cell array MCA2 may be separated from each other by a slit ST. The slit ST may extend vertically in a first direction D1 and horizontally in a third direction D3, The slit ST may be positioned between the first memory cell array MCA1 and the second memory cell array MCA2 that are positioned in a second direction D2. The slit ST may have a uniform thickness measured in the second direction D2.

Each of the first memory cell array MCA1 and the second memory cell array MCA2 may include a plurality of bit lines BL1 and BL2 and a plurality of transistors TR1 and TR2. The first memory cell array MCA1 may further include a plurality of first capacitors CAP1. The first capacitors CAP1 may be vertically stacked in the first direction D1, and may share a first common plate PL1. The second memory cell array MCA2 may further include a plurality of second capacitors CAP2. The second capacitors CAP2 may be vertically stacked in the first direction D1, and may share a second common plate PL2. The plate nodes PN of the first capacitors CAP1 may be interconnected to each other to be coupled to the first common plate PL1. The plate nodes PN of the second capacitors CAP2 may be interconnected to each other to be coupled to the second common plate PL2.

A first isolation layer SSL may be formed between the first bit lines BL1 and also between the second bit lines BL2 that are positioned adjacent to each other in the third direction D3. A second isolation layer LSL may be formed between the first capacitors CAP1 that are positioned adjacent to each other in the third direction D3. The second isolation layer LSL may extend to be positioned between the second capacitors CAP2 that are positioned adjacent to each other in the third direction D3, The first isolation layer SSL and the second isolation layer LSL may have different lengths in the second direction D2, For example, as illustrated in the embodiment of FIG. 1, the length of the second isolation layers LSL may be greater than the length of the first isolation layers SSL. The first and second isolation layers SSL and LSL may include, for example, silicon oxide, silicon nitride, silicon carbon oxide (SiCO), or a combination thereof. In an embodiment, the first and second isolation layers SSL and LSL may be made of the same material.

The slit ST may be formed between the second isolation layers LSL. The slit ST may extend in the third direction D3 through the second isolation layers LSL. The slit ST may include a dielectric material. The slit ST may include, for example, silicon oxide, silicon nitride, silicon carbon oxide (SiCO), or a combination thereof. The first common plate PL1 and the second common plate PL2 may be separated from each other by the slit ST.

The first common plate PL1 may be coupled to the first metal interconnection M1. The second common plate PL2 may be coupled to the second metal interconnection M2. A plate voltage may be independently applied to the first and second common plates PL1 and PL2, respectively.

The first memory cell array MCA1 may include a plurality of first memory cells MC1, Each of the first memory cells MC1 may include a first bit line BL1, a first transistor TR1, and a first capacitor CAP1. The second memory cell array MCA2 may include a plurality of second memory cells MC2. Each of the second memory cells MC2 may include a second bit line BL2, a second transistor TR2, and a second capacitor CAP2. In the first memory cell array MCA1, a plurality of first memory cells MC1 may be vertically stacked in the first direction D1. The first memory cells MC1 may be horizontally arranged in the third direction D3. In the second memory cell array MCA2, a plurality of second memory cells MC2 may be vertically stacked in the first direction D1. The second memory cells may be horizontally arranged in the third direction D3.

The first memory cell array MCA1 may be a first column array CA1 including first capacitors CAP1 that are stacked in the first direction D1. The first capacitors CAP1 of the first column array CA1 may be referred to as a first capacitor array. The second memory cell array MCA2 may be a second column array CA2 including second capacitors CAP2 that are stacked in the first direction D1. The second capacitors CAP2 of the second column array CA2 may be referred to as a second capacitor array. The first capacitors CAP1 of the first column array CA1 may share a first common plate PL1. The second capacitors CAP2 of the second column array CA2 may share a second common plate PL2. The first common plate PL1 of the first column array CA1 and the second common plate PL2 of the second column array CA2 may be separated from each other by the slit ST, The first column array CA1 may include a column array of the first memory cells MC1, and the second column array CA2 may include a column array of the second memory cells MC2.

The first memory cell array MCA1 and the second memory cell array MCA2 may form a row array RA of the first and second memory cells that are horizontally arranged in the second direction D2. The first capacitors CAP1 of the row array RA and the second capacitors CAP2 of the row array RA may be separated from each other by the slit ST. Each of the first capacitors CAP1 of the row array RA and the second capacitors CAP2 of the row array RA may include a storage node SN and a plate node PN that are separated from each other. The first common plate PL1 of the row array RA and the second common plate PL2 of the row array RA may be separated from each other by the slit ST.

In terms of another aspect, the first memory cell array MCA1 may form a first row array RA1 of first memory cells MC1 that are arranged horizontally in the third direction D3, and the second memory cell array MCA1 may form a second row array RA2 of second memory cells MC2 that are horizontally arranged in the third direction D3. The first capacitors CAP1 of the first row array RA1 may be separated from each other by the second isolation layers LSL.

The second capacitors CAP2 of the second row array RA2 may be separated from each other by the second isolation layers LSL.

The first memory cell array MCA1 may include first active layers ACT1 that are coupled to the first capacitors CAP1. The second memory cell array MCA2 may include second active layers ACT1 and ACT2 that are coupled to the second capacitors CAP2. The first memory cell array MCA1 may include a first double word line DWL1 extending in a direction crossing each of the first active layers ACT1, The second memory cell array MCA2 may include a second double word line DWL2 extending in a direction crossing each of the second active layers ACT2. The first capacitors CAP1 may be respectively coupled to the first active layers ACT1, and the second capacitors CAP2 may be respectively coupled to the second active Dyers ACT2.

A first transistor TR1 may include a first active layer ACT1 and first double word lines DWL1 and DWL2, The first double word line DWL1 may include a first word line WL1 and a second word line WL2 that are opposite to each other in the first direction D1 with the first active layer ACT1 interposed therebetween. A second transistor TR2 may include a second active layer ACT2 and a second double word line DWL2. The second double word line DWL2 may include a first word line WL1 and a second word line WL2 that are opposite to each other in the direction D1 with the second active layer ACT2 interposed therebetween.

A gate dielectric layer GD may be positioned between the first active layer ACT1 and the first double word lines DWL1. A gate dielectric layer GD may be positioned between the second active layers ACT2 and the second double word lines DWL2. The gate dielectric layer GD may be formed between the first word line WL1 and the first active layers ACT1 and also between the first word line WL1 and the second active layers ACT2. The gate dielectric layer GD may be formed between the second word line WL2 and the first active layers ACT1 and also between the second word line WL2 and the second active layers ACT2. Each of the first and second capacitors CAP1 and CAP2 may include a storage node SN, a dielectric layer DE, and a plate node PN.

Each of the first and second bit lines BL1 and BL2 may have a pillar shape extending in the first direction D1. The first and second active layers ACT1 and ACT2 may have a bar shape extending in the second direction D2 crossing the first direction D1. The first and second double word lines DWL1 and DWL2 may have a line shape extending in the third direction D3 crossing the first and second directions D1 and D2.

The first and second bit lines BL1 and BL2 may be vertically oriented in the first direction D1, The first and second bit lines BL1 and BL2 may be referred to as vertically oriented bit lines or pillar-type bit lines. The first and second bit lines BL1 and BL2 may include a conductive material. The first and second bit lines BL1 and BL2 may include a silicon-based material, a metal-based material, or a combination thereof. The first and second bit lines BL1 and BL2 may include silicon, a metal, a metal nitride, a metal silicide, or a combination thereof. The first and second bit lines BL1 and BL2 may include, for example, polysilicon, titanium nitride, tungsten, or a combination thereof. For example, the first and second bit lines BL1 and BL2 may include, for example, polysilicon or titanium nitride (TiN) which is doped with an N-type impurity. The bit lines BL1 and BL2 may include a TiN/W stack including titanium nitride and tungsten over the titanium nitride.

The first and second bit lines BL1 and BL2 may be coupled to a bit line pad BLP. The bit line pad BLP may be positioned between the first and second memory cell arrays MCA1 and MCA2 and the lower structure LS. The first bit line BL1 and the second bit line BL2 that are positioned adjacent to each other in the second direction D2 may be commonly coupled to the bit line pad BLP.

The first and second double word lines DWL1 and DWL2 may extend long in the third direction D3, and the first and second active layers ACT1 and ACT2 may extend in the second direction D2. The first and second active layers ACT1 and ACT2 may be horizontally arranged in the second direction D2 from the first and second bit lines BL1 and BL2. Each of the first and second double word lines DWL1 and DWL2 may include a pair of word lines, that is, a first word line WL1 and a second word line WL2. The first word line WL1 and the second word line WL2 may face each other in the first direction D1 with the first and second active layers ACT1 and ACT2 interposed therebetween. A gate dielectric layer GD may be formed on the upper and lower surfaces of the first and second active layers ACT1 and ACT2.

In the first and second double word lines DWL1 and DWL2, the same voltage may be applied to the first word line WL1 and the second word line WL2. For example, the first word line WL1 and the second word line WL2 may form a pair, and the same word line driving voltage may be applied to the first word line WL1 and the second word line WL2. As such, the semiconductor device 100 according to the embodiment of the present invention may have a double word line structure in which two first and second word lines WL1 and WL2 are positioned adjacent to one first and second active layers ACT1 and ACT2.

According to another embodiment of the present invention, different voltages may be applied to the first word line WL1 and the second word line WL2. For example, a word line driving voltage may be applied to the first word line WL1, and a ground voltage may be applied to the second word line WL2. The second word line WL2 may be referred to as a back word line or a shield word line. According to another embodiment of the present invention, a ground voltage may be applied to the first word line WL1, and a word line driving voltage may be applied to the second word line WL2.

The first and second active layers ACT1 and ACT2 may include a semiconductor material. The first and second active layers ACT1 and ACT2 may include a silicon-containing layer or a silicon germanium-containing layer. For example, the first and second active layers ACT1 and ACT2 may include silicon, monocrystalline silicon, doped polysilicon, undoped polysilicon, amorphous silicon, silicon germanium, or a combination thereof. According to another embodiment of the present invention, the first and second active layers ACT1 and ACT2 may include a nano-wire or a nano sheet, and the nano-wire and the nano sheet may be formed of a semiconductor material, According to another embodiment of the present invention, the first and second active layers ACT1 and ACT2 may include an oxide semiconductor material. The first and second active layers ACTT and ACT2 may include a first source/drain region, a second source/drain region, and a channel between the first source/drain region and the second source/drain region. The first source/drain region and the second source/drain region may be formed in the first and second active layers ACT1 and ACT2 by ion implantation of impurities or plasma doping.

Each of the first and second word lines WL1 and WL2 of the first and second double word lines DWL1 and DWL2 may include notched sidewalls that are facing each other. Each of the notched sidewalls may include flat surfaces WLF and recessed surfaces WLR. The flat surfaces WLF and the recessed surfaces WLR may be alternately repeated in the third direction D3. The flat surfaces WLF may be flat sidewalk, and the recessed surfaces WLR may be recessed sidewalls. The flat surfaces WLF may face each other in the second direction D2. In the second direction D2, the recessed surfaces WLR may face each other.

The first and second active layers ACT1 and ACT2 may have a thickness which is smaller than those of the first and second word lines WL1 and WL2. For example, the vertical thicknesses of the first and second active layers ACT1 and ACT2 in the first direction D1 may be smaller than the vertical thickness of each of the first and second word lines WL1 and WL2 in the first direction D1, As described above, the thin first and second active layers ACT1 and ACT2 may be referred to as thin-body active layers.

The gate dielectric layer GD may include, for example, silicon oxide, silicon nitride, a metal oxide, a metal oxynitride, a metal silicate, a high-k material, a ferroelectric material, an anti-ferroelectric material or a combination thereof. The gate dielectric layer GD may include $SiO_2$, $Si_3N_4$, $HfO_2$, $Al_2O_3$, $ZrO_2$, AlON, HfON, HfSiO, HfSiON, or HfZrO.

The first and second word lines WL1 and WL2 of the first and second double word lines DMA and DWL2 may include a metal, a metal mixture, a metal alloy, or a semiconductor material. The first and second word lines WL1 and WL2 of the first and second double word lines DWL1 and DWL2 may include titanium nitride, tungsten, polysilicon, or a combination thereof. For example, the first and second word lines WL1 and WL2 of the first and second double word lines DWL1 and DWL2 may include a TiN/W stack in which titanium nitride and tungsten are sequentially stacked. The first and second word lines WL1 and WL2 of the first and second double word lines DWL1 and DWL2 may include an N-type work-function material or a P-type work-function material. The N-type work-function material may have a low work-function of approximately 4.5 eV or less, and the P-type work-function material may have a high work-function of approximately 4.5 eV or more.

The first and second capacitors CAP1 and CAP2 may be positioned horizontally from the first and second transistors TR1 and TR2 in the second direction D2. The first and second capacitors CAP1 and CAP2 may include a storage node SN that extends horizontally from the first and second active layers ACT1 and ACT2 in the second direction D2. The first and second capacitors CAP1 and CAP2 may further include a dielectric layer DE and a plate node PN over the storage node SN, The storage node SN, the dielectric layer DE, and the plate node PN may be arranged horizontally in the second direction D2. The storage node SN may have a horizontally oriented cylinder shape. The dielectric layer DE may conformally cover the cylindrical inner wall and the cylindrical outer wall of the storage node SN. The plate node PN may have a shape extending to the cylindrical inner wall and the cylindrical outer wall of the storage node SN over the dielectric layer DE. The storage node SN may be electrically connected to the first and second active layers ACT1 and ACT2.

The storage node SN may have a three-dimensional structure, and the storage node SN of the three-dimensional structure may have a horizontal three-dimensional structure which is oriented in the second direction D2. As an example of the three-dimensional structure, the storage node SN may have a cylinder shape.

According to another embodiment of the present invention, the storage node SN may have a pillar shape or a pylinder shape. The pylinder shape may refer to a structure in which a pillar shape and a cylinder shape are merged.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The plate node PN may include a combination of a metal-based material and a silicon-based material. For example, the plate node PN may be a stack of titanium nitride's con germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node SN over the titanium nitride, and titanium nitride (TiN) may serve as the plate nodes PN of the first and second capacitors CAP1 and CAP2, and tungsten nitride may be a low-resistance material.

The dielectric layer DE may be referred to as a capacitor dielectric layer. The dielectric layer DE may include, for example, silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including at least zirconium oxide ($ZrO_2$). The dielectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (Hf)-based oxide. The dielectric layer DE may have a stack structure including at least hafnium oxide ($HfO_2$). The dielectric layer DE may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy (which will be, hereinafter, simply referred to as bandgap) than zirconium oxide ($ZrO_2$) and hafnium oxide ($HfO_2$), Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap than the high-k material. The dielectric layer DE may include, for example, ($SiO_2$) as a high bandgap material other than aluminum oxide ($Al_2O_3$), Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminated structure, or a mixed structure including zirconium oxide, hafnium oxide, and aluminum oxide.

According to another embodiment of the present invention, the dielectric layer DE may include a ferroelectric material or an antiferroelectric material, Each of the first capacitors CAP1 and the second capacitors CAP2 may include a ferroelectric capacitor. The ferroelectric material may include HfZrO, HfSiO, or a combination thereof. Also, the ferroelectric material may include Lead Zirconate Titanate (PZT), Barium Strontium Titanate (BST), Strontium Bismuth Tantalate (SBT), barium titanate (BTO), bismuth lanthanum titanate (BLT), $BaTiO_3$, $PbTiO_3$, $BiFeO_3$, $SrTiO_3$, $PbMgNdO_3$, $PbMgNbTiO_3$, $PbZrNbTiO_3$, $PbZrTiO_3$, $KNbO_3$, $LiNbO_3$, $LiTaO_3$, $KNaNbO_3$, or $BaSrTiO_3$.

According to another embodiment of the present invention, an interface control layer for improving leakage current may be further formed between the storage node SN and the dielectric layer DE. The interface control layer may include titanium oxide ($TiO_2$), niobium oxide, or niobium nitride. The interface control layer may also be formed between the plate node PN and the dielectric layer DE.

The first and second capacitors CAP1 and CAP2 may include a metal-insulator-metal (MIM) capacitor. The storage node SN and the plate node PN may include a metal-based material.

The semiconductor device 100 of FIGS. 1 and 2 may be a DRAM or a ferroelectric memory (FeRAM).

According to another embodiment of the present invention, the first and second capacitors CAP1 and CAP2 may be replaced with another data storage material. For example, the data storage material may be a phase change material, a magnetic tunnel junction (MTJ), or a variable resistance material.

The first and second active layers ACT1 and ACT2 that are positioned adjacent to each other in the first direction D1 may contact one first bit line BL1 and one second bit line BL2. The first and second active layers ACT1 and ACT2 that are positioned adjacent to each other in the third direction D3 may share the first and second double word lines DWL1 and DWL2, In the first and second memory cell arrays MCA1 and MCA2, a plurality of first and second double word lines DWL1 and DWL2 may be vertically stacked in the first direction D1. Each of the first and second double word lines DWL1 and DWL2 may include a pair of the first word line WU and the second word line WL2. Between the first word line WL1 and the second word line WL2, a plurality of the first and second active layers ACT1 and ACT2 may be arranged horizontally to be spaced apart from each other in the third direction D3. According to another embodiment of the present invention, the structure of the first and second double word lines DWL1 and DWL2 may be replaced with a single word line structure including the first word line WL1 alone or the second word line WL2 alone.

The lower structure LS may be a material suitable for semiconductor processing. The lower structure LS may include at least one among a conductive material, a dielectric material, and a semiconductor material. The lower structure LS may include a semiconductor substrate, and the semiconductor substrate may be formed of a silicon-containing material. The lower structure LS may include silicon, monocrystalline silicon, polysilicon, amorphous silicon, silicon germanium, monocrystalline silicon germanium, polycrystalline silicon germanium, carbon-doped silicon, a combination thereof, or a mufti-layer thereof. The lower structure LS may also include another semiconductor material, such as germanium. The lower structure LS may include a III/V-group semiconductor substrate, for example, a compound semiconductor substrate, such as GaAs. The lower structure LS may include a Silicon-On-Insulator (SOI) substrate.

According to another embodiment of the present invention, the lower structure LS may include peripheral circuits. The peripheral circuits may include a plurality of peripheral circuit transistors. The peripheral circuits may be positioned at a lower level than the first and second memory cell arrays MCA1 and MCA2. This may be referred to as a COP (Cell-Over-Peripheral) structure. The peripheral circuits may include at least one control circuit for driving the first and second memory cell arrays MCA1 and MCA2, The at least one control circuit of the peripheral circuit may include an N-channel transistor, a P-channel transistor, a CMOS circuit, or a combination thereof. The at least one control circuit of the peripheral circuits may include an address decoder circuit, a read circuit, a write circuit, and the like. The at least one control circuit of the peripheral circuits may include a planar channel transistor, a recess channel transistor, a buried gate transistor, a fin channel transistor (FinFET), and the like.

For example, the peripheral circuits may include sub-word line drivers and a sense amplifier. The first and second double word lines DWL1 and DWL2 may be coupled to the sub-word line driver. The first and second bit lines BL1 and BL2 may be coupled to the sense amplifier.

According to another embodiment of the present invention, the lower structure LS may be positioned at a higher level than the first and second memory cell arrays MCA1 and MCA2. This may be referred to as a Peripheral-Over-Cell (PUC) structure. In the PUC structure, the peripheral circuits may be positioned at a higher level than the first and second memory cell arrays MCA1 and MCA2.

Referring to FIGS. 1 and 2, the slit ST may serve to separate the first capacitor CAP1 and the second capacitor CAP2 from each other. The slit ST may separate the first common plate PL1 and the second common plate PL2 from each other. Formation of the slit ST allows applying a plate voltage on the basis of each capacitor. Accordingly, it is possible to maximize the ferroelectric characteristics and reduce the power consumption required for an operation, while increasing the operation speed.

As the slit ST is formed, the common plates may be driven independently for each memory cell array. The memory cells of one memory cell array may be simultaneously read or written, thereby reducing a page size and a page buffer size. Accordingly, the area and power consumption may be improved.

Also, when the common plate is driven, the capacitance may be reduced by half so as to decrease the plate driving power and increase the driving speed.

FIGS. 3 to 20 illustrate a method for fabricating a semiconductor device in accordance with an embodiment of the present invention. FIGS. 3 to 20 are cross-sectional views illustrating the fabrication method taken along a line A-A' of FIG. 1.

Figure 3:
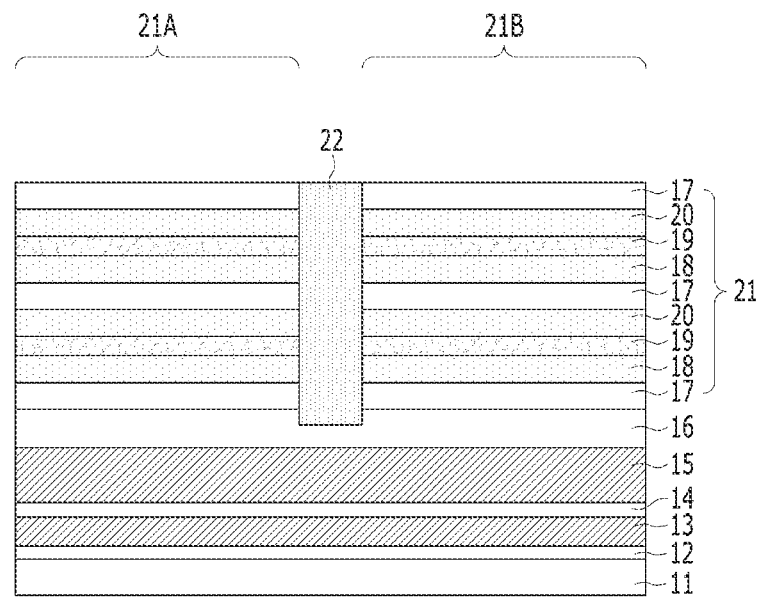
FIGS. 3 to 20 illustrate a method for fabricating a semiconductor device in accordance with an embodiment of the present invention.

Referring to FIG. 3, a stack body 21 may be formed over the lower structure 11. The stack body 21 may be formed by repeatedly stacking a sub-stack in which a dielectric layer 17, a first sacrificial layer 18, a semiconductor layer 19, and a second sacrificial layer 20 are sequentially stacked. The dielectric layers 17 may be silicon oxide, and the first and second sacrificial layers 18 and 20 may be silicon nitride. The semiconductor layers 19 may include a silicon layer, a monocrystalline silicon layer, or a polysilicon layer. In the stack body 21, the uppermost layer may be the dielectric layer 17.

The lower structure 11 may include peripheral circuits, A bit line pad 13, a sacrificial pad 15, and a plurality of inter-layer dielectric layers 12, 14, and 16 may be formed over the lower structure 11. Each of the bit line pad 13 and the sacrificial pad 15 may include a metal-based material. For example, the bit line pad 13 and the sacrificial pad 15 may include tungsten, titanium nitride, or a combination thereof. A first inter-layer dielectric layer 12 may be formed between the bit line pad 13 and the lower structure 11, A second inter-layer dielectric layer 14 may be formed between the bit line pad 13 and the sacrificial pad 15, A third inter-layer dielectric layer 16 may be formed between the sacrificial pad 15 and the stack body 21, The first to third inter-layer dielectric layers 12, 14, and 16 may include, for example, silicon oxide, silicon nitride, or a combination thereof.

Subsequently, the slit 22 may be formed in the stack body 21, The slit 22 may have a trench shape. The slit 22 may include, for example, silicon oxide, silicon nitride, silicon carbon oxide, or a combination thereof. The slit 22 may be formed by etching the stack body 21 to form a trench and then filling the trench with a dielectric material.

The slit 22 may divide the stack body 21 into a first stack body 21A and a second stack body 21B. The first memory cell array MCA1 as shown in FIGS. 1 and 2 may be formed in the first stack body 21A, and the second memory cell array MCA2 as shown in FIGS. 1 and 2 may be formed in the second stack body 21B.

Figure 4:
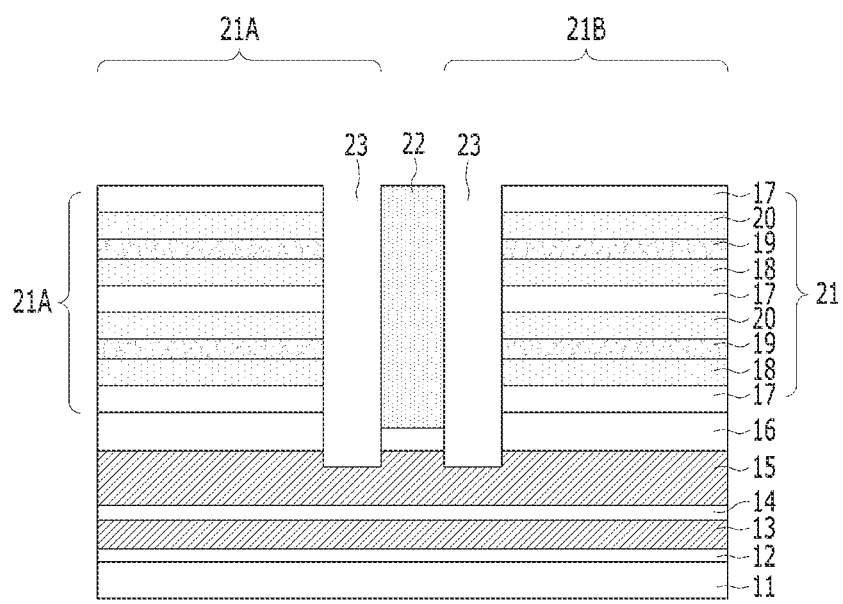

Referring to FIG. 4, first openings 23 may be formed by etching portions of the first and second stack bodies 21A and 21B. The first openings 23 may be respectively formed on both sides of the slit 22. To form the first openings 23, portions of the first and second stack bodies 21A and 21B may be etched, and then the third inter-layer dielectric layer 16 may be etched until the sacrificial pad 15 is exposed. An etching process for forming the first openings 23 may stop at the sacrificial pad 15. A small upper part of the sacrificial pad may be etched. The first openings 23 may be respectively formed in the first stack body 21A and the second stack body 21B with the slit 22 interposed therebetween.

Figure 5:
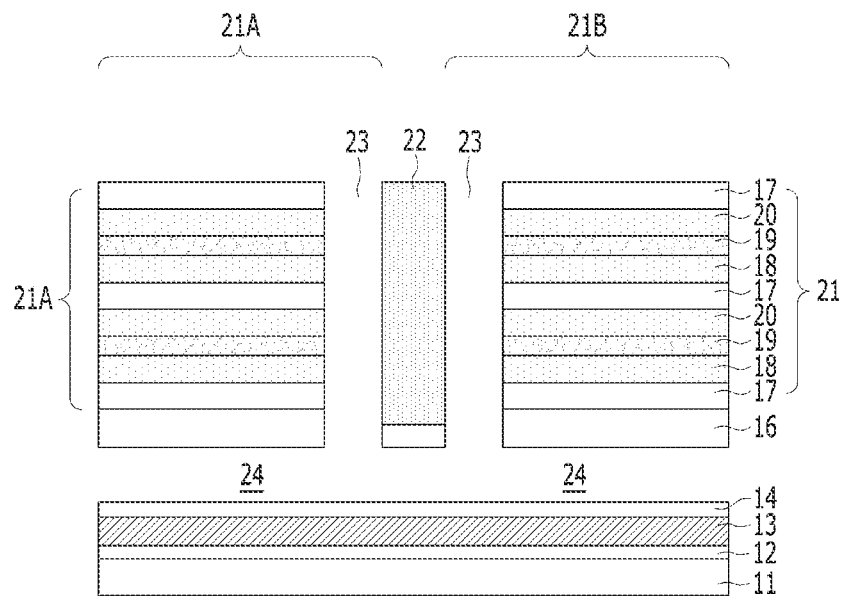

Referring to FIG. 5, the sacrificial pad 15 may be selectively removed through the first openings 23. As a result, a sacrificial recess 24 may be formed in the space from which the sacrificial pad 15 is removed. The first openings 23 and the sacrificial recess 24 may be interconnected. The sacrificial recess 24 may horizontally extend along an entire width of the first and second stack bodies 21A and 21B. The sacrificial recess 24 may horizontally extend from a far end of the first stack body 21A to a far end of second stack body 21B. A far end of each of the first stack bodies 21A and 218 is an end opposite to an end proximate to respective first openings 23.

Figure 6:
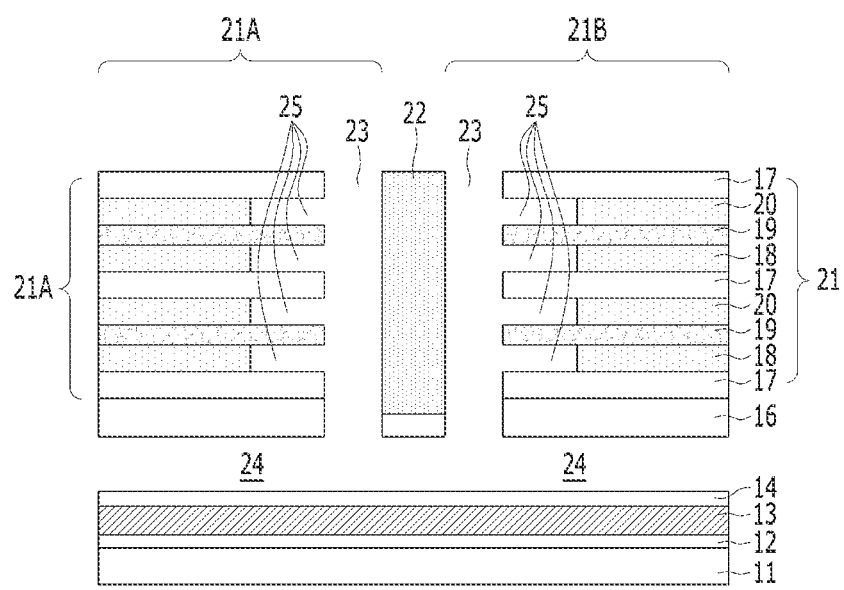

Referring to FIG. 6, the first and second sacrificial layers 18 and 20 may be recessed through the first openings 23 to form first horizontal recesses 25 exposing some surfaces of the semiconductor layers 19. The first horizontal recesses 25 may be formed in the first stack body 21A and the second stack body 21B, respectively. The first horizontal recesses 25 may form pairs of horizontally symmetrical recesses with the slit 22 interposed therebetween. For example, from the perspective of the same horizontal level as the second sacrificial layer 20, pairs of the first horizontal recesses 25 may be horizontally symmetrical with the slit 22 interposed therebetween. In the first stack body 21A, the first horizontal recesses 25 may be vertically disposed. Also, in the second stack body 21B, the first horizontal recesses 25 may be vertically disposed. In one sub-stack of the first and second stack bodies 21A and 21B, that is, the stack of the first sacrificial layer 18, the semiconductor layer 19 and the second sacrificial layer 20 between the dielectric layers 17, a pair of first horizontal recesses 25 may be positioned with the semiconductor layer 19 interposed therebetween.

Figure 7:
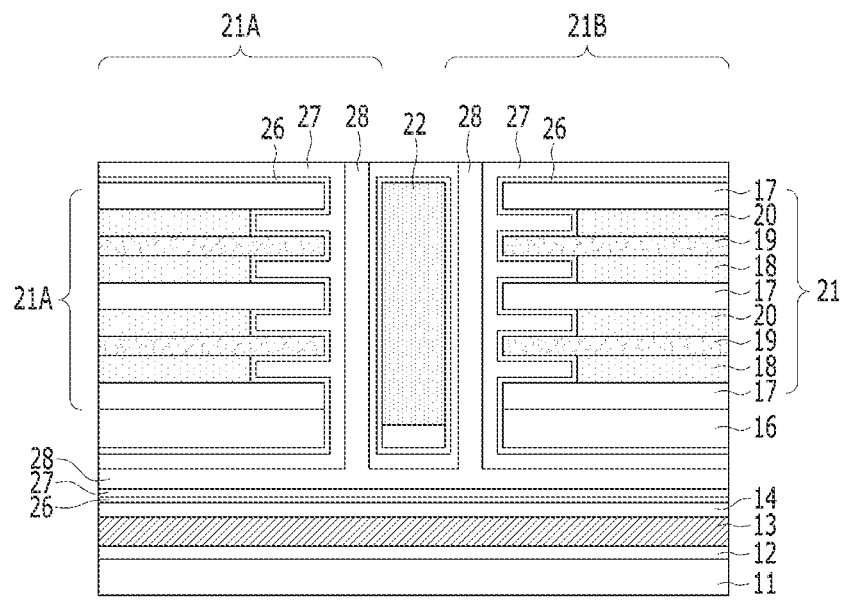

Referring to FIG. 7, first and second liner layers 26 and 27 may be formed to fill the first horizontal recesses 25. The first liner layer 26 may conformally cover the first horizontal recesses 25, and the second liner layer 27 may fill the first horizontal recesses 25 over the first liner layer 26. The first and second liner layers 26 and 27 may be formed in the sacrificial recess 24, The first liner layer 26 may be silicon oxide, and the second liner layer 27 may be silicon nitride. The first and second liner layers 26 and 27 may surround the slit 22.

A third liner layer 28 filling the first openings 23 and the sacrificial recess 24 may be formed over the second liner layer 27. The third liner layer 28 may include, for example, silicon oxide. Subsequently, the third liner layer 28 may be planarized to expose the top surface of the second liner layer 27.

Figure 8:
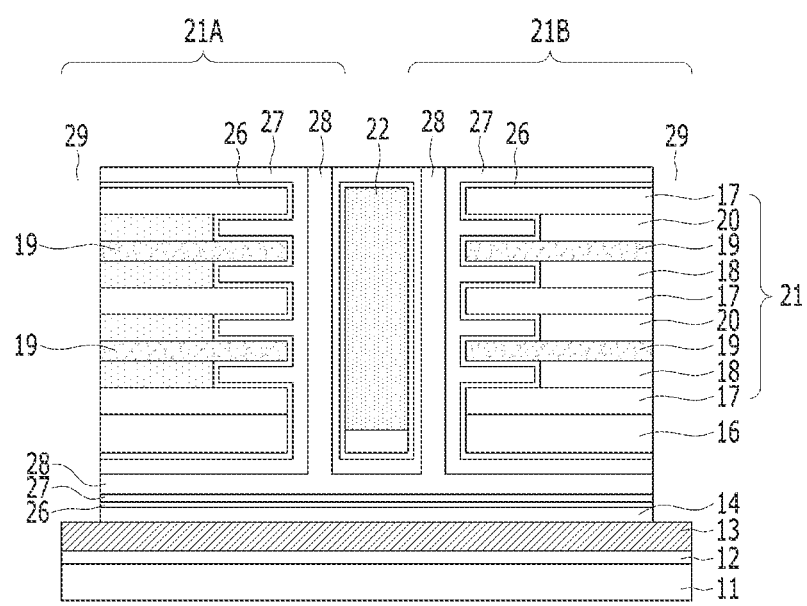

Referring to FIG. 8, second openings 29 may be formed by etching another portion of the stack body 21, The second openings 29 may be formed by etching portions of the stack body 21 and then continuously etching the third inter-layer dielectric layer 16, the first liner layer 26, the second liner layer 27, and the third liner layer 28 until the bit line pad 13 is exposed. The etching process for forming the second openings 29 may stop at the bit line pad 13.

Figure 9:
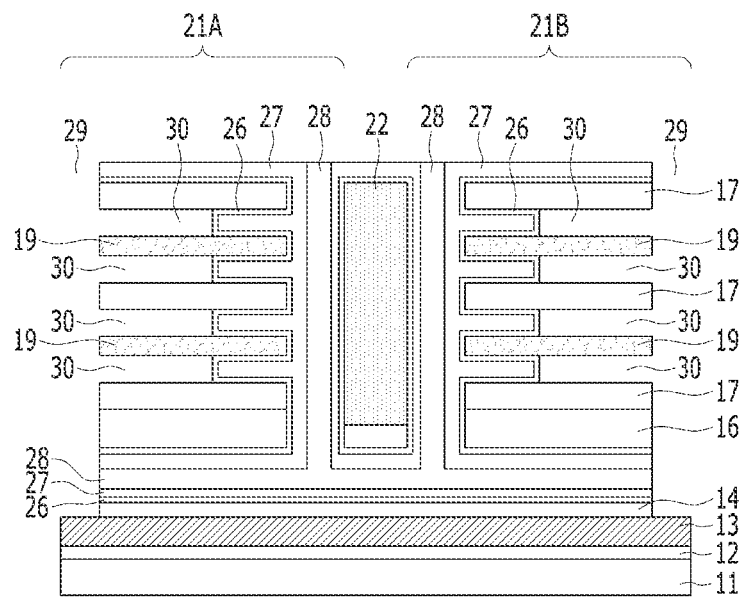

Referring to FIG. 9, the remaining first and second sacrificial layers 18 and 20 may be removed through the second openings 29, As a result, second horizontal recesses 30 exposing some surfaces of the semiconductor layers 19 may be formed. The remaining first and second sacrificial layers 18 and 20 may be removed by a wet etching process, and the wet etching process for forming the second horizontal recesses 30 may stop at the first liner layer 26.

Figure 10:
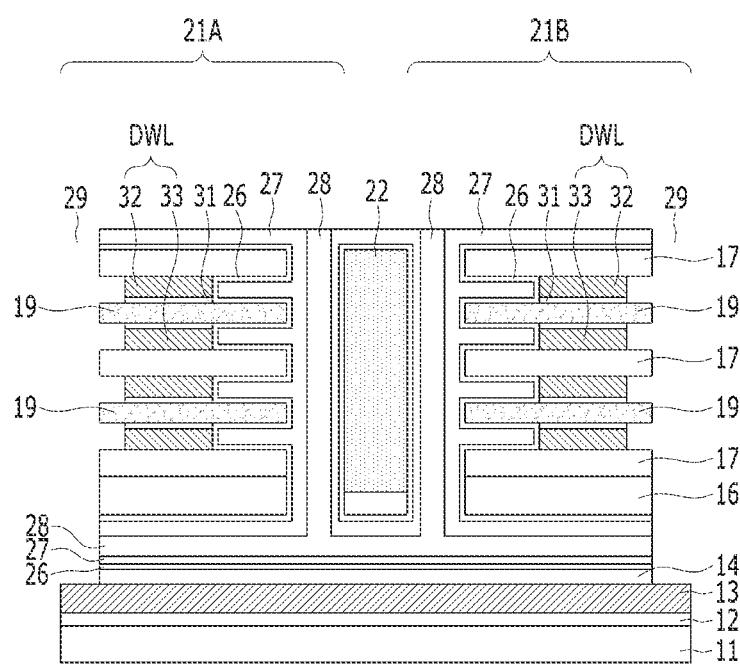

Referring to FIG. 10, a gate dielectric layer 31 may be formed over the exposed semiconductor layers 19. The gate dielectric layer 31 may be formed by an oxidation process or a deposition process. The gate dielectric layer 31 may include, for example, silicon oxide, silicon nitride, a high-k layer, or a combination thereof. The gate dielectric layer 31 may be formed on the upper and lower surfaces of the semiconductor layers 19.

Subsequently, a first word line 32 and a second word line 33 partially filling the second horizontal recesses 30 may be formed over the gate dielectric layer 31. The first and second word lines 31 and 32 may form double word lines DWL1 and DWL2.

Figure 11:
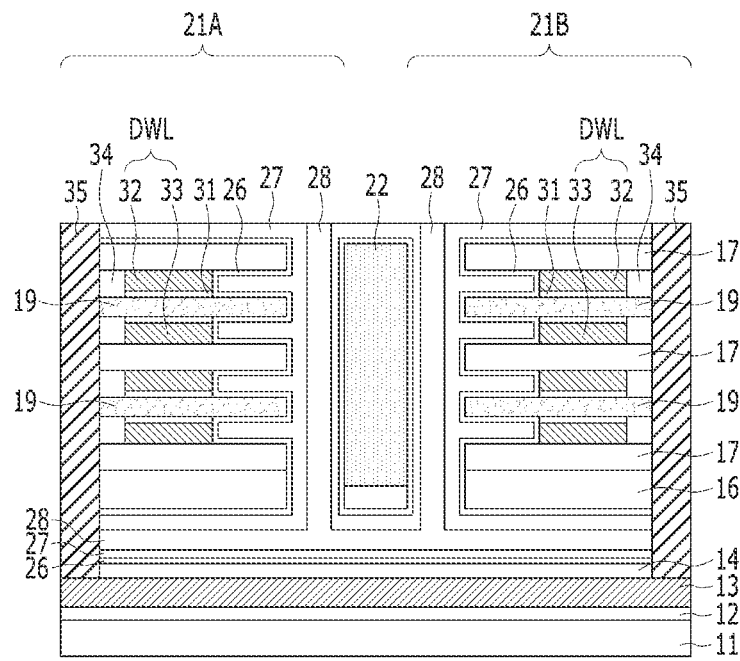

Referring to FIG. 11, bit lines 35 filling the second openings 29 may be formed. Before the bit lines 35 are formed, a capping layer 34 may be formed on the sidewalls of the double word lines DWL1 and DWL2. The capping layer 34 may include, for example, silicon oxide, silicon nitride, silicon carbon oxide, or a combination thereof. The bit lines 35 may be coupled to the bit line pad 13.

Figure 12:
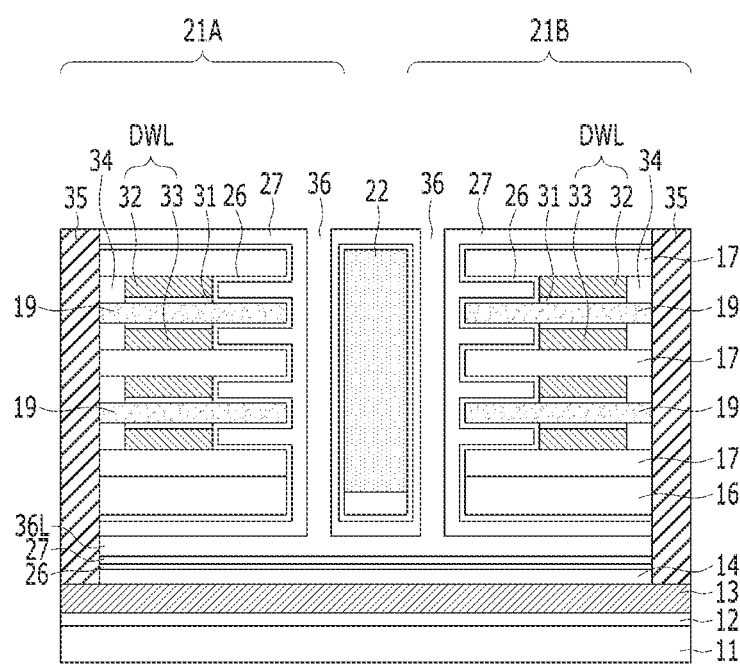

Referring to FIG. 12, the third openings 36 may be formed by selectively removing the third liner layer 28. The third openings 36 may be defined between the first liner layer 26 and the second liner layer 27, A lower level third opening 36L extending from the third openings 36 may be formed. The lower level third opening 36L may extend horizontally, and the third opening 36 may extend vertically.

Figure 13:
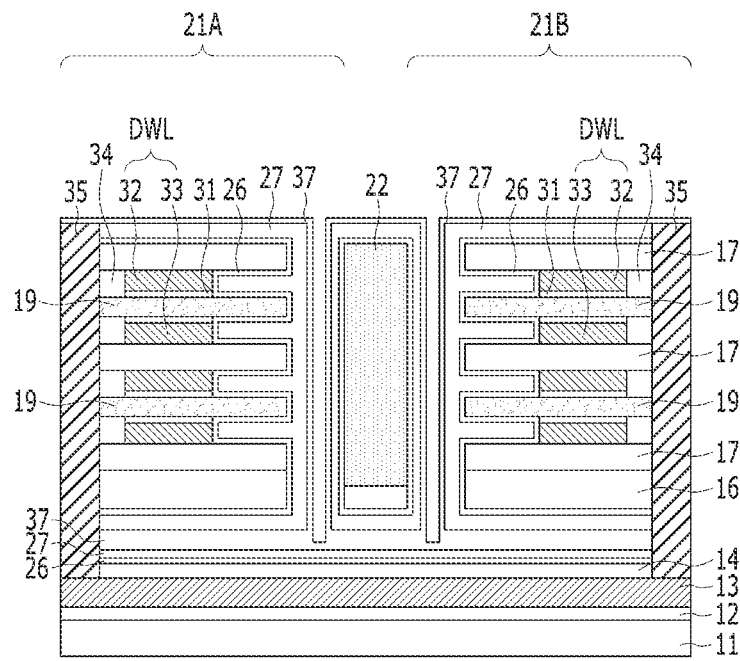

Referring to FIG. 13, a gap-fill layer 37 may be formed over the third openings 36 and the lower-level third opening 36L. The gap-fill layer 37 may fill the lower-level third opening 36L and conformally cover a sidewall of the third opening 36, The gap-fill layer 37 may not fill the third openings 36.

Figure 14:
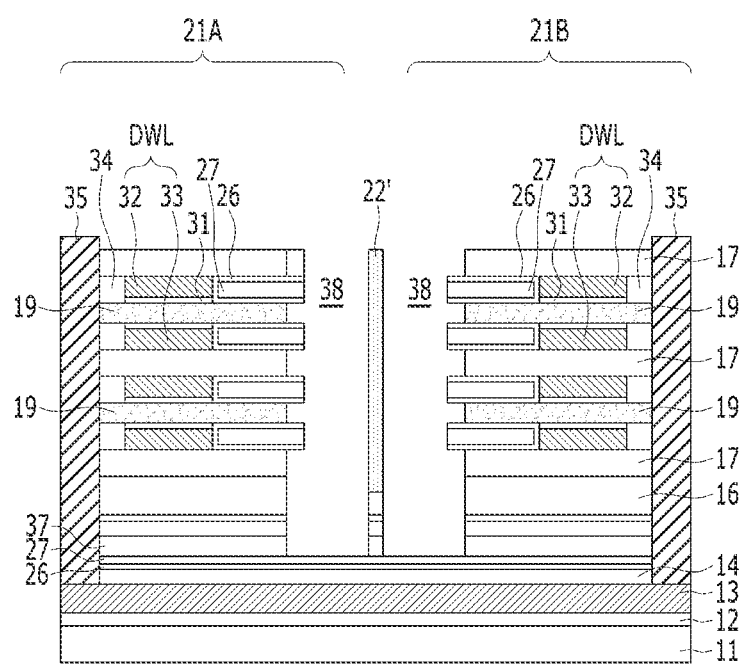

Referring to FIG. 14, the first liner layer 26, the second liner layer 27, and the gap-fill layer 37 may be selectively removed to form fourth openings 38. Subsequently, the dielectric layers 17 may be horizontally recessed. During the process of forming the fourth openings 38 and the process of recessing the dielectric layers 17, the slit 22 may be trimmed as indicated by a reference numeral 22'. The first liner layer 26, the second liner layer 27, and the gap-fill layer 37 may remain in the lower-level third opening 36L.

The stack of the first liner layer 26 and the second liner layer 27 may include a portion that protrudes more than the semiconductor layers 19. In other words, recess space of the dielectric layers 17 may be provided on the upper and lower surfaces of the semiconductor layers 19.

Figure 15:
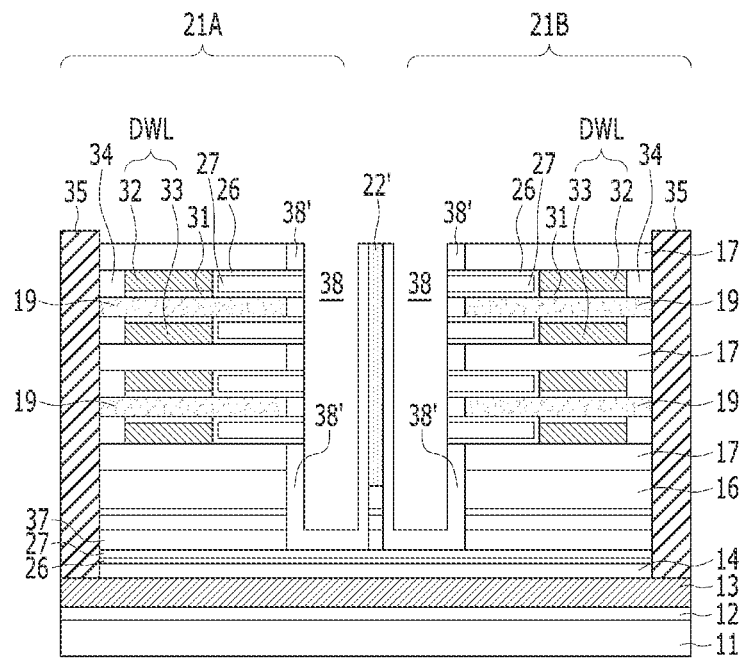

Referring to FIG. 15, recessed capping layers 38' may be formed in the recess spaces of the dielectric layers 17, The recessed capping layers 38' may extend to be positioned on the sidewalls of the trimmed slit 22', The recessed capping layers 38' may include a dielectric material. The recessed capping layers 38' may include, for example, silicon nitride.

The first liner layer 26 and the second liner layer 27 may remain between the dielectric layers 17 and the semiconductor layers 19. The recessed capping layers 38' may be positioned in the recess spaces of the dielectric layers 17 that are positioned on the upper and lower surfaces of the semiconductor layers 19.

Figure 16:
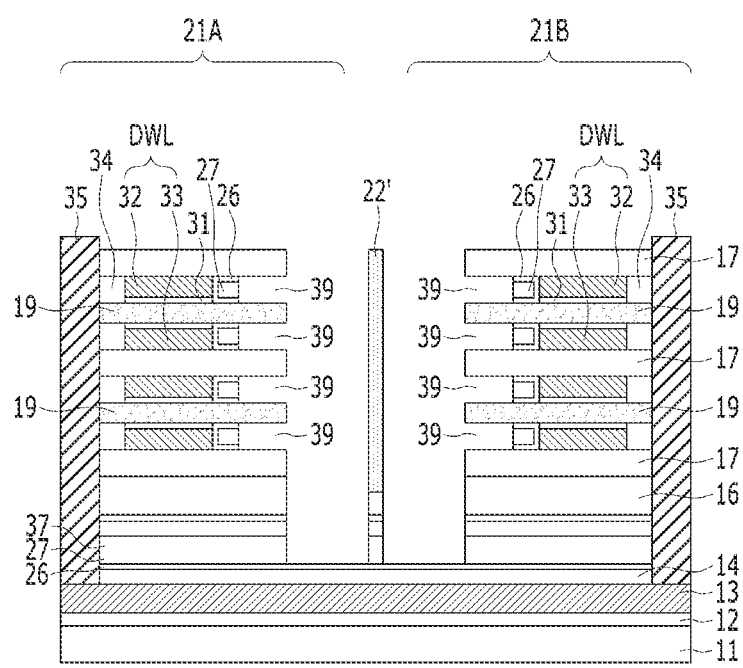

Referring to FIG. 16, the recessed capping layers 38' may be removed. Subsequently, the first liner layer 26 and the second liner layer 27 may be selectively recessed. As a result, second horizontal recesses 39 may be formed. The second horizontal recesses 39 may expose the surfaces of the semiconductor layers 19'. The first liner 26 and the second liner 27 may remain between the dielectric layers 17, and the second horizontal recesses 39 may be formed between the dielectric layers 17'.

Figure 17:
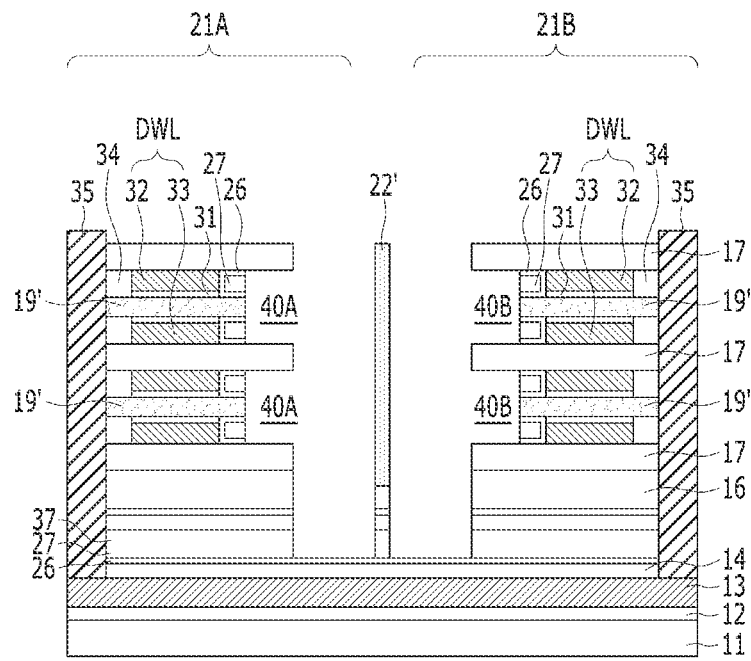

Referring to FIG. 17, the semiconductor layers 19 exposed by the second horizontal recesses 39 may be cut. As a result, capacitor recesses 40A and 40B may be formed. The capacitor recesses 40A and 40B may be formed between dielectric layers 17. The semiconductor layers remaining after being cut may become an active layer 19'. The capacitor recesses 40A and 40B may be horizontally separated from each other with the slit 22' interposed therebetween.

Figure 18:
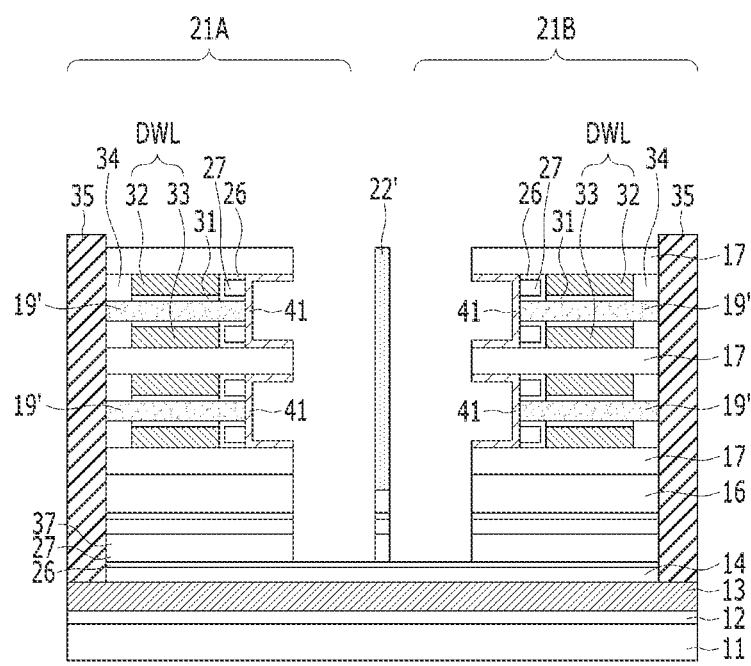

Referring to FIG. 18, a storage node 41 may be formed in each of the capacitor recesses 40A and 40B. The storage nodes 41 may be coupled to the active layers 19', respectively. The storage nodes 41 may be separated from each other by the dielectric layer 17.

Figure 19:
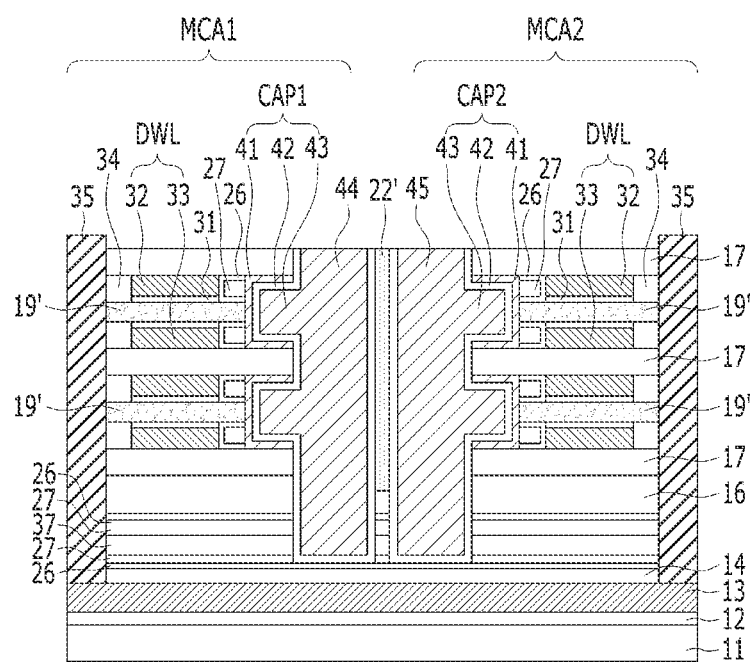

Referring to FIG. 19, a dielectric layer 42 may be formed over the storage nodes 41. Plate nodes 43 may be formed over the dielectric layer 42, and common plates 44 and 45 may be formed over the plate nodes 43, The plate nodes 43 and the common plates 44 and 45 may have an integrated structure. The common plates 44 and 45 may include a first common plate 44 and a second common plate 45.

A plurality of first capacitors CAP1 and a plurality of second capacitors CAP2 that are separated from each other by the slit 22' may be formed. The first and second capacitors CAP1 and CAP2 may each include a storage node 41, a dielectric layer 42, and a plate node 43. The plate nodes 43 of the first capacitors CAP1 may be coupled to the first common plate 44, and the plate nodes 43 of the second capacitors CAP2 may be coupled to the second common plate 45.

As described above, as the first capacitors CAP1 and the second capacitors CAP2 are formed, a first memory cell array MCA1 and a second memory cell array MCA2 separated from each other by the slit 22' may be formed.

The first capacitors CAP1 and the first memory cell array MCA1 may correspond to the first capacitors CAP1 and the first memory cell array MCA1 as illustrated in FIGS. 1 and 2. The second capacitors CAP2 and the second memory cell array MCA2 may correspond to the second capacitors CAP2 and the second memory cell array MCA2 as illustrated in FIGS. 1 and 2.

Figure 20:
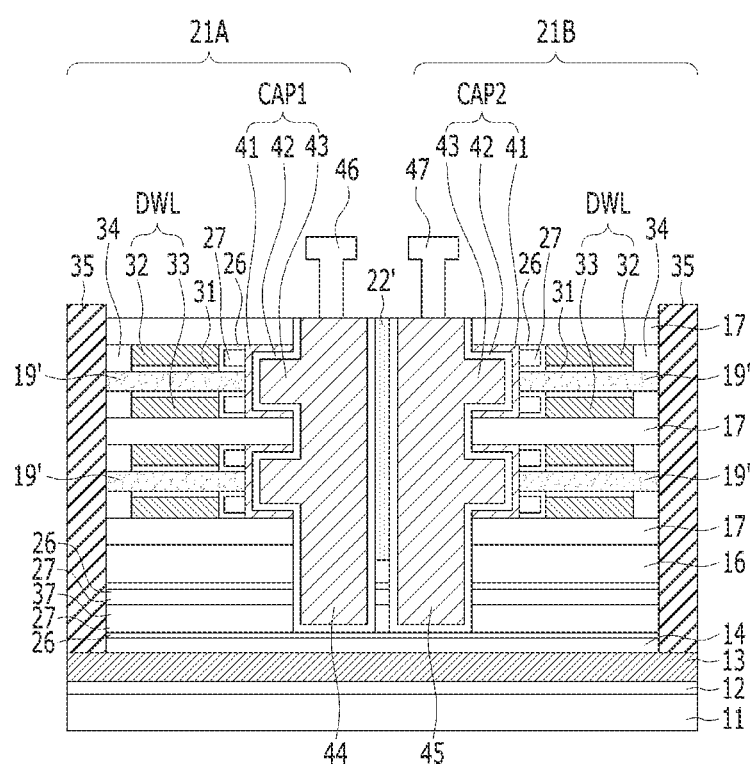

Referring to FIG. 20, a first metal interconnection 46 may be formed over the first common plate 44. A second metal interconnection 47 may be formed over the second common plate 45.

The first metal interconnection 46 may be coupled to the first common plate 44. The second metal interconnection 47 may be coupled to the second common plate 45. The first capacitors CAP1 of the first memory cell array MCA1 may operate alone through the first metal interconnection 46. The second capacitors CAP2 of the second memory cell array MCA2 may operate alone through the second metal interconnection 47.

Referring to FIGS. 3 to 20, the method for fabricating a semiconductor device may include forming the stack body 21 over the lower structure 11 (see FIG. 3), forming a slit 22' in the stack body 21 (see FIG. 14) to divide the stack body 21 into a first stack body 21A and a second stack body 21B, forming a first capacitor recess 40A and a second capacitor recess 40B that are separated from each other with the slit 22' interposed therebetween by etching the first stack body 21A and the second stack body 21B (see FIG. 17), and forming a first capacitor CAP1 and a second capacitor CAP2 in the first capacitor recess 40A and the second capacitor recess 40B, respectively (see FIG. 19).

According to the embodiment of the present invention, a plate voltage may be applied on the basis of an individual capacitor by forming a slit between the neighboring capacitors. Accordingly, it is possible to maximize capacitor characteristics, reduce power consumption for an operation, and increase an operation rate.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
   a first common plate extending vertically in a first direction;
   a second common plate which is spaced apart from the first common plate in a second direction and extends vertically in the first direction;
   a slit formed between the first common plate and the second common plate;
   a first memory cell array sharing the first common plate and including first capacitors that are vertically stacked in the first direction; and
   a second memory cell array sharing the second common plate and including second capacitors that are vertically stacked in the first direction.

2. The semiconductor device of claim 1, wherein the slit extends vertically in the first direction between the first common plate and the second common plate.

3. The semiconductor device of claim 1, wherein the slit includes a dielectric material.

4. The semiconductor device of claim 1, further comprising:
   a first metal interconnection coupled to the first common plate; and
   a second metal interconnection coupled to the second common plate.

5. The semiconductor device of claim 1, wherein each of the first capacitors and the second capacitors includes:
   a storage node;
   a dielectric layer over the storage node; and
   a plate node over the dielectric layer.

6. The semiconductor device of claim 5, wherein the plate nodes of the first capacitors are coupled to the first common plate, and
   the plate nodes of the second capacitors are coupled to the second common plate.

7. The semiconductor device of claim 5, wherein the dielectric layer includes a high-k material or a ferroelectric material.

8. The semiconductor device of claim 1, wherein each of the first memory cell array and the second memory cell array further includes:
   a bit line extending in the first direction;
   an active layer extending from the bit line in the second direction; and
   a word line extending in a third direction crossing the active layer over the active layer.

9. The semiconductor device of claim 8, wherein the word line includes a first word line and a second word line that are positioned on an upper surface and a lower surface of the active layer.

10. The semiconductor device of claim 1, further comprising: peripheral circuits positioned at a lower or higher level than the first and second memory cell arrays.

11. A semiconductor device, comprising:
    a substructure;
    a first capacitor array including first capacitors that are arranged in a first direction which is perpendicular to a surface of the lower structure;
    a second capacitor array spaced apart from the first capacitor array in a second direction and including second capacitors that are vertically arranged in the first direction;
    a first common plate extending vertically in the first direction and coupled to the first capacitor array;
    a second common plate extending vertically in the first direction and coupled to the second capacitor array; and
    a slit positioned between the first common plate and the second common plate and extending vertically in the first direction.

12. The semiconductor device of claim 11, wherein the slit includes a dielectric material.

13. The semiconductor device of claim 11, further comprising:
    a first metal interconnection coupled to the first common plate; and
    a second metal interconnection coupled to the second common plate.

14. The semiconductor device of claim 11, wherein each of the first capacitors and the second capacitors includes:
    a storage node;
    a dielectric layer over the storage node; and
    a plate node over the dielectric layer.

15. The semiconductor device of claim 14, wherein the plate nodes of the first capacitors are coupled to the first common plate, and
    the plate nodes of the second capacitors are coupled to the second common plate.

16. The semiconductor device of claim 14, wherein the dielectric layer includes a high-k material or a ferroelectric material.

17. The semiconductor device of claim 11, further comprising:
    first and second bit lines extending vertically in the first direction;
    first active layers coupled to the first bit line and stacked in the first direction;
    second active layers coupled to the second bit line and stacked in the first direction;
    first double word lines extending in a direction crossing each of the first active layers; and
    second double word lines extending in a direction crossing each of the second active layers,
    wherein the first capacitors are respectively coupled to the first active layers, and
    wherein the second capacitors are respectively coupled to the second active layers.

* * * * *